United States Patent
Born et al.

(10) Patent No.: US 7,564,247 B2
(45) Date of Patent: Jul. 21, 2009

(54) OPERATING ELEMENT WITH A PROXIMITY SENSOR AND SHIELD

(75) Inventors: Frank Born, Ober-Mörlen (DE); Norbert Mankel, Marburg (DE); Joerg Reinhardt, Lahnau (DE); Stefan Schaefer, Wetzlar (DE); Dirk Wüstenbecker, Asslar (DE)

(73) Assignee: Siemens Aktiengesellschaft, Müchen (DE)

( * ) Notice: Subject to any disclaimer, the term of this patent is extended or adjusted under 35 U.S.C. 154(b) by 119 days.

(21) Appl. No.: 11/472,669

(22) Filed: Jun. 22, 2006

(65) Prior Publication Data

US 2006/0290359 A1 Dec. 28, 2006

(30) Foreign Application Priority Data

Jun. 24, 2005 (DE) .................... 10 2005 029 503

(51) Int. Cl.
*G01R 27/26* (2006.01)
*H03K 17/975* (2006.01)
*H01H 47/12* (2006.01)

(52) U.S. Cl. .................. 324/658; 324/662; 324/688; 361/181; 200/600

(58) Field of Classification Search .......... 324/658, 324/661, 662, 686, 688; 361/179, 181; 200/600
See application file for complete search history.

(56) References Cited

U.S. PATENT DOCUMENTS

| 3,419,697 A | 12/1968 | Gove |
| 3,564,541 A | 2/1971 | Gove |
| 3,750,113 A | 7/1973 | Cencel |
| 3,823,355 A | 7/1974 | Batz |
| 4,466,046 A | 8/1984 | Cherry |
| 4,849,852 A | 7/1989 | Mullins |
| 5,270,710 A * | 12/1993 | Gaultier et al. ............. 200/600 |
| 5,363,051 A | 11/1994 | Jenstrom et al. |
| 6,194,903 B1 | 2/2001 | Schulz |
| 6,373,265 B1 | 4/2002 | Morimoto |
| 6,933,732 B2 * | 8/2005 | Morimoto .................... 324/661 |

(Continued)

FOREIGN PATENT DOCUMENTS

DE   1 537 946   1/1970

(Continued)

OTHER PUBLICATIONS

NASA TechBrief (XP 00064/298), Lyndon B. Johnson Space Center, Houston, Texas, "Keyboard With Voice Output", MTIS Tech Notes Jun. 1986 (pg. 1).

(Continued)

*Primary Examiner*—Timothy J Dole
(74) *Attorney, Agent, or Firm*—Cohen Pontani Lieberman & Pavane LLP

(57) ABSTRACT

An operating element, in particular for a motor vehicle component, includes an actuating element that is movably supported in a carrier element and acts, in particular, on a switch element. To detect an approach of a user to the operating element, but at the same time to prevent a misdetection by a movable component, an electrically conductive sensor element of a capacitive proximity sensor and at least one shielding element are arranged in an interior space of the actuating element, the sensor element and the shielding element being connected to a printed circuit board in an electrically conducting fashion.

12 Claims, 5 Drawing Sheets

U.S. PATENT DOCUMENTS

| | | |
|---|---|---|
| 6,980,199 B2 | 12/2005 | Rekimoto |
| 7,091,886 B2 * | 8/2006 | DePue et al. ............... 200/600 |
| 7,123,028 B2 * | 10/2006 | Okada et al. ............... 324/681 |
| 2002/0171439 A1 | 11/2002 | Ono |
| 2003/0169231 A1 | 9/2003 | Rekimoto |
| 2005/0115816 A1 * | 6/2005 | Gelfond et al. ............. 200/339 |
| 2006/0180447 A1 * | 8/2006 | Korultay et al. ............ 200/329 |

FOREIGN PATENT DOCUMENTS

| | | |
|---|---|---|
| DE | 39 10 977 | 10/1990 |
| DE | 197 01 899 | 10/1997 |
| EP | 1 228 917 | 8/2002 |

OTHER PUBLICATIONS

Office Action dated Feb. 14, 2008 issued for the counterpart European Patent Application 06 113 922.6.

Search Report dated Oct. 20, 2006 for the corresponding European Patent Application No. EP 06 11 3922.

* cited by examiner

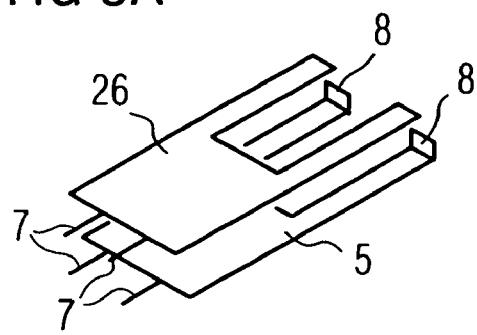
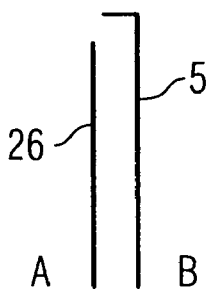
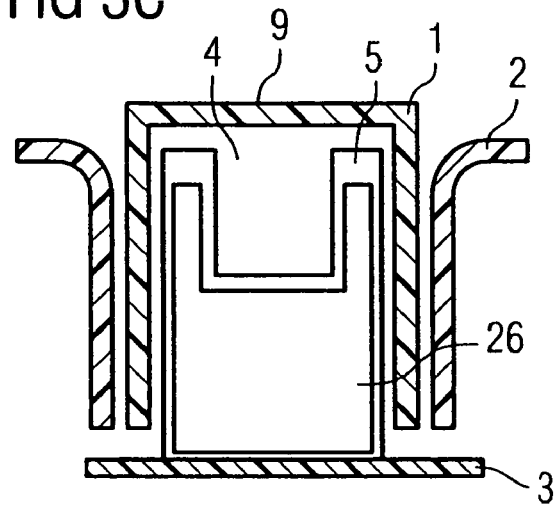
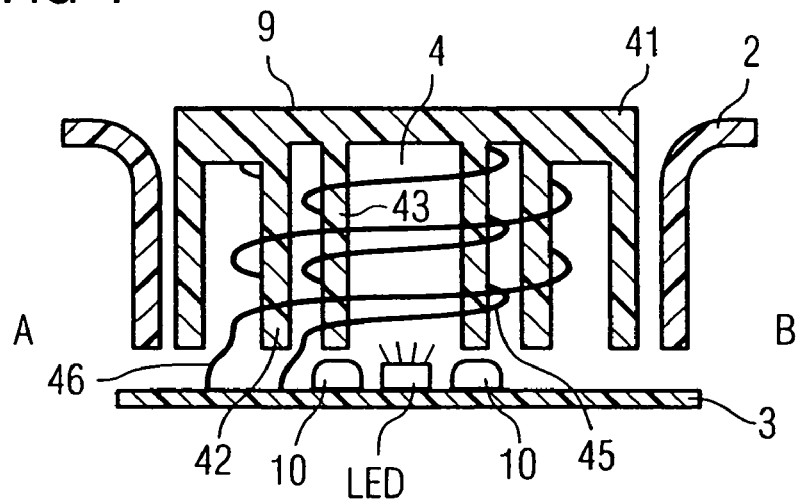

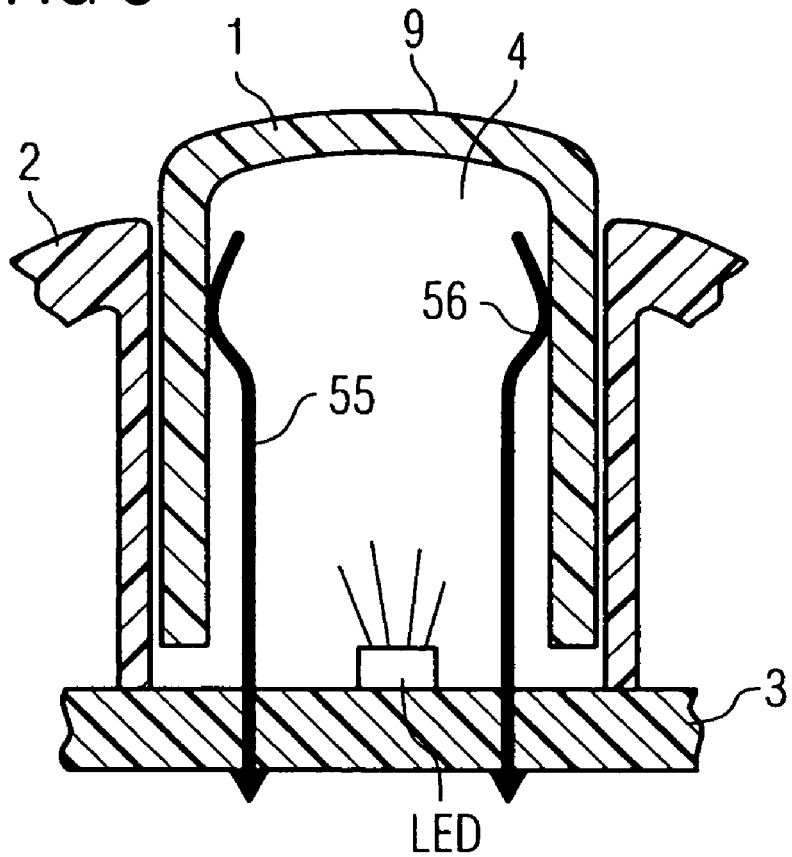
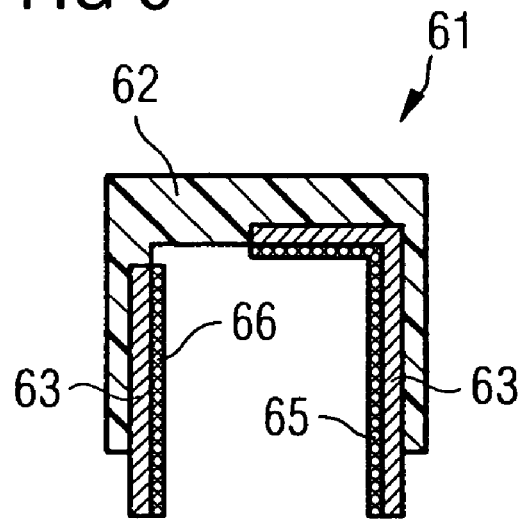

OPERATING ELEMENT WITH A PROXIMITY SENSOR AND SHIELD

BACKGROUND OF THE INVENTION

The invention relates to an operating element for a motor vehicle component, having an actuating element that is movably supported in a carrier element and acts, in particular, on a switch element. The invention further relates to a motor vehicle component comprising an operating unit having at least one operating element, and a further movable component.

In order to operate motor vehicle components such as, for example, a radio set, a navigation unit, a car phone, a multimedia installation and the like, use is frequently made of operating and display devices that are arranged ergonomically in the vehicle. In this case, the display device should be arranged such that the driver can detect the latter with the least possible distraction from the road traffic. The display unit is therefore preferably arranged in the region of the dashboard or in the upper region of a central console. The operating unit is preferably arranged such that the driver can reach it with his fingers without extensive arm movement. However, this arrangement of the operating unit has the disadvantage that the operating unit can be only very poorly detected in optical terms. The driver will therefore frequently select the operating element of the operating unit without making visual contact with the keys. It is therefore desirable to detect the approach of the driver's hand to an operating element in order thus, for example, to be able to output in the display device a reference to the type of the operating element or to the function to be operated thereby, or else to be able to output an acoustic reply before the operating element has been actuated and the action associated therewith has been executed. In addition, movable components such as, for example, a CD slot may be located in the region of the central console in which the operating unit is arranged, for example, such that, furthermore, a movement of this further component may not falsely be interpreted as an approach of an operator's hand to the operating element.

SUMMARY OF THE INVENTION

An object of the invention is to provide an operating element, i.e., a pushbutton, such that an approach to the operating element is detected with no impediment to the conventional functionality of the operating element and such that malfunctions owing to adjacent movable components are avoided. A further object consists in appropriately developing a generic motor vehicle component with an operating unit, having at least one operating element, and a further movable component.

The object is achieved by an operating element comprising a carrier element, an actuating element movably supported in the carrier element and defining an interior space; a switch element, the actuating element acting on the switch element; and a printed circuit board having a sensor element of a capacitive proximity sensor and a shielding element, the sensor element and the shielding element being electrically conductively connected to the printed circuit board, the shielding element arranged and dimensioned for limiting a range of detection of the sensor element, the sensor element and the shielding element each being arranged at least partially within the interior space of the actuating element.

The object is also not by a motor vehicle component a motor vehicle component comprising an operating unit having at least one operating element and a further movable component, the operating element comprising a carrier element, an actuating element movably supported in the carrier element and defining an interior space; a switch element, the actuating element acting on the switch element; and a printed circuit board having a sensor element of a capacitive proximity sensor and a shielding element, the sensor element and the shielding element being electrically conductively connected to the printed circuit board, the shielding element arranged and dimensioned for limiting a range of detection of the sensor element, the sensor element and the shielding element each being arranged at least partially within the interior space of the actuating element, the shielding element being arranged between the movable component and the sensor element such that the sensor element is prevented from detecting movement of the movable component.

Arranged in the actuating element of the operating element is an electrically conductive sensor element (sensor electrode) of a capacitive proximity sensor that is connected to a printed circuit board in an electrically conducting fashion. The arrangement of the sensor element in the actuating element means that the sensor element is invisible to the user and therefore in no way impairs the visual appearance of the operating element. Owing to the corresponding electrically conductive connection of the sensor element to the printed circuit board, a sensor signal can be passed on in a simple way from the sensor element to signal-processing elements that are arranged, in particular, on the printed circuit board itself. By suitably arranging the sensor element in the actuating element and connecting it in a suitable way to the printed circuit board, it is possible for the conventional functionality of the operating element, in particular a pushbutton, not to be impaired.

Furthermore, at least one shielding element that is likewise connected to the printed circuit board in an electrically conducting fashion is arranged in the interior space of the actuating element. The shielding element limits the range of detection of the sensor element. The shielding element is an electrically conductive element connected to frame. The shielding element thus, in particular, prevents the sensor element from possibly being influenced by a movable component such as, for example, a retractable display screen or a CD or DVD slot. A movement of the movable component is therefore not interpreted as an approach of a user to the operating element. The at least one shielding element is arranged for this purpose between the movable component and the sensor element. If there is a wish to shield the sensor element against movement in various spatial directions, a number of shielding elements are used, or one shielding element is appropriately designed.

Since the available interior space of the actuating element is limited, and it is also necessary to arrange an illumination element there as a rule in addition to the sensor element and the shielding element, particular care is required with regard to the configuration of the sensor element and of the shielding element.

The at least one shielding element can be designed in the shape of a pin. This configuration requires only very little installation space for the shielding element, although it has been proven that such a configuration is already sufficient for shielding the influence of undesired movements.

The sensor element can be designed in an L-shaped or T-shaped fashion. This configuration makes available a sensor surface that runs parallel to a front surface of the actuating element and therefore is particularly suitable for detecting approaches to the operating element from the front side. The regions of the sensor element that are parallel to lateral surfaces of the actuating element can then be shielded by shielding elements against movements occurring to the side of the operating element, for example the movement of a CD slot.

The sensor element and the shielding element can be designed in the manner of a spiral spring, the spiral-shaped sensor element being arranged radially inside the spiral-shaped shielding element. In the case of this configuration, movements occurring radially in relation to the sensor element are shielded by the spiral-shaped shielding element, whereas movements from a front side can be detected by the sensor element without hindrance by the shielding element. In particular, the actuating element in this case has webs that support the spiral-shaped configuration of the sensor element and/or shielding element.

The sensor element and the shielding element can bear against opposite internal sides of the actuating element in a resiliently biased fashion. This configuration ensures that contact is avoided between the sensor element and the shielding element. It is necessary to avoid contact between the shielding element and the sensor element, as otherwise the shielding element connected to frame likewise connects the sensor element to frame, and the latter element thereby loses its ability to function.

The sensor element and the shielding element can respectively be designed as a conductive coating of a subregion of the actuating element. In this configuration, both the sensor element and the shielding element are directly integrated in the actuating element, and so additional parts are not required and mounting is simplified. The actuating element thereby consists, in particular, of a two-component plastic part, it being possible to metallize one of the plastic components. The metallization of this component implements both the sensor element and the shielding element. If a sidewall of the actuating element is metallized, as shielding element it can therefore shield movements from this lateral direction. Appropriately marked regions of the actuating element can be used for a soldered connection to a printed circuit board.

The sensor element and the shielding element can be fastened on a hollow cylindrical member whose inside wall is, in particular, of reflecting design. This configuration therefore provides a separate member on which both the sensor element and the shielding element are fastened. Alternatively, the shielding element and the sensor element can in turn be designed as a metallic surface coating of the hollow cylindrical member. The hollow cylindrical configuration of the member has the advantage that a light source for illuminating the operating element can further be arranged in its interior. If the inside wall of the hollow cylindrical member is, in addition, designed in a reflecting fashion, the light of the light source can be used to illuminate the actuating element without sizeable losses.

The sensor element and the shielding element can be interconnected in a self-closed fashion by a nonconducting intermediate layer. In particular, the sensor element and the shielding element thereby form a hollow cylinder in whose recess an illumination element can be arranged. The sensor element and the shielding element can be interconnected by bonding, clipping or reshaping, for example caulking. The sensor element and shielding element are electrically insulated from one another in this case, for example, by a nonconducting coating. The already assembled element comprising sensor element and shielding element is placed directly as a unit on the printed circuit board and soldered. Reference pins can be provided in the sensor element and/or the shielding element for centering on the printed circuit board in the interests of good positioning accuracy. These pins can also be directly soldered during soldering. The advantage of this configuration resides in that only a minimum installation space is required, since the sensor element and the shielding element can be implemented with very thin sheets. Additional plastic parts are not required.

Connected to the printed circuit board can be a further printed circuit board which projects into the interior space of the actuating element and on which the sensor element and the shielding element are arranged. Even given a very small installation space, this solution can be used to implement an appropriate operating element owing to the low space requirement of the further printed circuit board. Both the sensor element and the shielding element are implemented as conducting surfaces on only one additional member, specifically the further printed circuit board.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In the drawings wherein like reference character denote similar elements throughout the several views:

FIGS. 3a and 3b are perspective views of a sensor element and shielding element according to a third embodiment of a pushbutton according to the present invention;

FIG. 3c is a sectional view of the pushbutton of FIGS. 1a and 1b;

FIG. 4 is a sectional view of a fourth embodiment of a pushbutton with spiral shielding and sensor elements;

FIG. 5 is a sectional view of a fifth embodiment of a pushbutton with resiliently biased sensor and shielding elements;

FIG. 6 is a sectional view of a sixth embodiment of a pushbutton with metallic coating for producing the sensor and shielding elements;

DETAILED DESCRIPTION OF THE PRESENTLY PREFERRED EMBODIMENTS

Figure 1A:
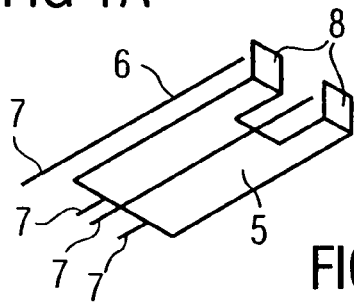
FIGS. 1a and 1b are perspective views of a sensor element and shielding element according to an embodiment of a pushbutton according to the present invention.
Figure 1C:
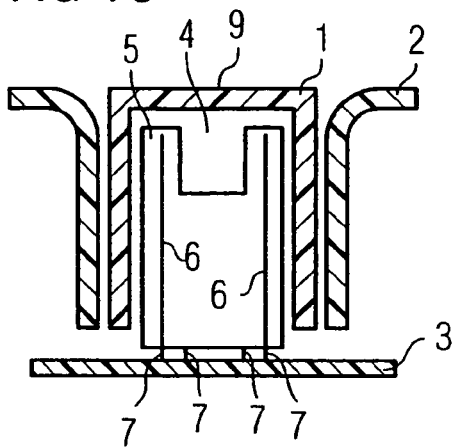
FIG. 1c is a sectional view of the pushbutton of FIGS. 1a and 1b.

FIG. 1c is a schematic of a pushbutton having a linearly movable actuating element 1 that is supported in a linearly movable fashion in a conventional way in the stop 2. When the actuating element 1 is pressed, it is moved toward the printed circuit board 3. The actuating element 1 is reset to the rest position by means of a spring element (not illustrated), for example. The actuating element 1 has an interior space 4. A sensor element 5 of a capacitive proximity sensor and two shielding elements 6 designed in the shape of a pin are arranged in the interior space 4. Both the sensor element 5 and the pin-type shielding elements 6 are connected in a conducting fashion by connecting pins 7 to the printed circuit board 3 which, in particular, contains further components for evaluating the signal of the sensor element 5.

Figure 1B:
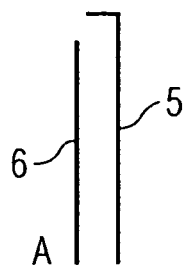

FIG. 1a illustrates a perspective view, and FIG. 1b a side view of the sensor element 5 and pin-type shielding elements 6, thus showing their assignment in more detail. The sensor element 5 is of L-shaped design, the sensor surfaces 8 being assigned to a front side 9 of the actuating element 1, and movements in front of the front side 9 being detected. By contrast, the influence of movements in the space A (FIG. 1b) on the sensor element 5 is suppressed by the pin-type shielding elements 6. The shielding elements 6 require only very little installation space owing to their pin-type configuration.

Figure 2A:
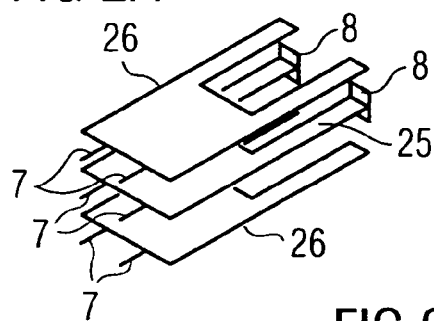
FIGS. 2a and 2b are perspective views of a sensor element and shielding element according to a second embodiment of a pushbutton according to the present invention.
Figure 2C:
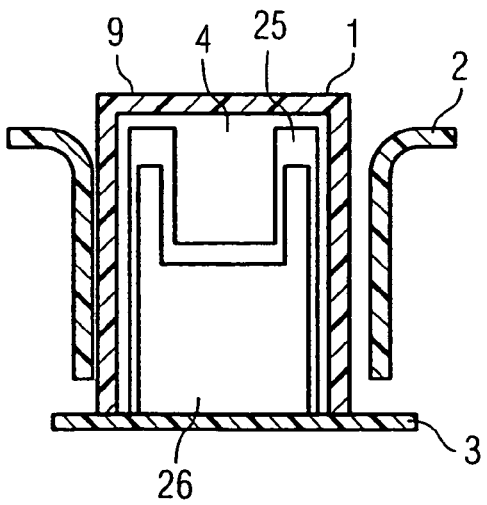
FIG. 2c is a sectional view of the pushbutton of FIGS. 1a and 1b.

FIG. 2c is a schematic of a second configuration of a pushbutton having an actuating element 1 in whose interior space 4 there are arranged a sensor element 25 and two shielding elements 26 that are respectively electrically connected to the printed circuit board 3. The design of the pushbutton corresponds in principle to the design in accordance with FIG. 1, although the construction of the sensor elements and of the shielding elements is different.

Figure 2B:
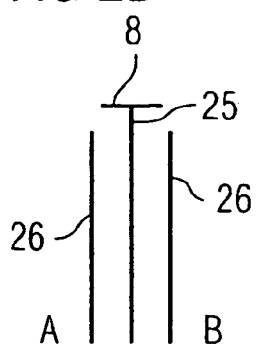

FIG. 2a shows a perspective illustration of the assignment of the shielding elements 26 to the sensor element 25, while FIG. 2b shows a side view. The sensor element 25 is of T-shaped design and has two sensor surfaces 8 that are assigned to the front side 9 of the actuating element 1. The shielding elements 26 are of planar design and assigned to the two sides of the sensor element 25. This arrangement shields movements both in space A and in space B, and these therefore have no influence on the sensor element 25. Consequently, movements on two sides of the pushbutton are shielded in this configuration.

FIGS. 3a-3c show a further configuration of a pushbutton, use being made here, otherwise than in the configuration in accordance with FIG. 2, of only one shielding element 26, and an L-shaped sensor element 5 coming into use here as with the configuration in accordance with FIG. 1. In this configuration, the influence of movements in space A is therefore eliminated, while movements in space B are detected.

FIG. 4 shows a schematic of a further configuration of a pushbutton. Here, the actuating element 41 now has webs 42 and 43. The sensor element 45 and the shielding element 46 are of spiral design and are guided through the webs 42, 43. The radius of the spiral shielding element 46 is larger than the radius of the spiral sensor element 45, such that the influence of movements occurring laterally in spaces A and B on the sensor element 45 is eliminated. The sensor element 45 extends, however, closer to the front side 9 than the shielding element 46, and so movements in front of the front side 9 are detected by the sensor element 45.

Furthermore, a light-emitting diode LED is arranged on the printed circuit board 3. Arranged, furthermore, on the printed circuit board 3 are two switch elements 10 on which the actuating element 41 acts. Such a light-emitting diode LED and such switch elements 10 can also be present in the case of all embodiments described previously and in what follows.

FIG. 5 is a schematic of a further configuration of a pushbutton, the sensor element 55 and the shielding element 56 now bearing in a resiliently biased fashion against opposite sides of the actuating element 1. The specific configuration of the sensor element 55 and of the actuating element 56 for producing resilient biasing positions these reliably inside the actuating element so as reliably to avoid inadvertent contact between the sensor element 55 and the shielding element 56 even when the pushbutton is used in motor vehicles and in the case of the vibrations continually occurring there. Furthermore, sufficient space remains for a light-emitting diode LED.

FIG. 6 shows a further configuration of an actuating element 61 that can be used in an operating element according to the invention. The actuating element 61 is produced as a two-component injection-molded part, specifically with a first component 62 made from a first, non-metalizable plastic material, and a second component 63 made from a metalizable plastic material. The sensor element 65 and the shielding element 66 are implemented on the second component 63 as a metallic surface coating. The advantage of this configuration resides in the fact that both the sensor element 65 and the shielding element 66 are directly integrated in the actuating element 61. Sliders, for example, can be used to make contact between the sensor element 65 or shielding element 66 and a printed circuit board. Alternatively, it is also possible for appropriately marked regions of the plastic injection-molded part that contain a sensor element 65 and/or the shielding element 66 to be connected to the printed circuit board by soldering.

Figure 7:
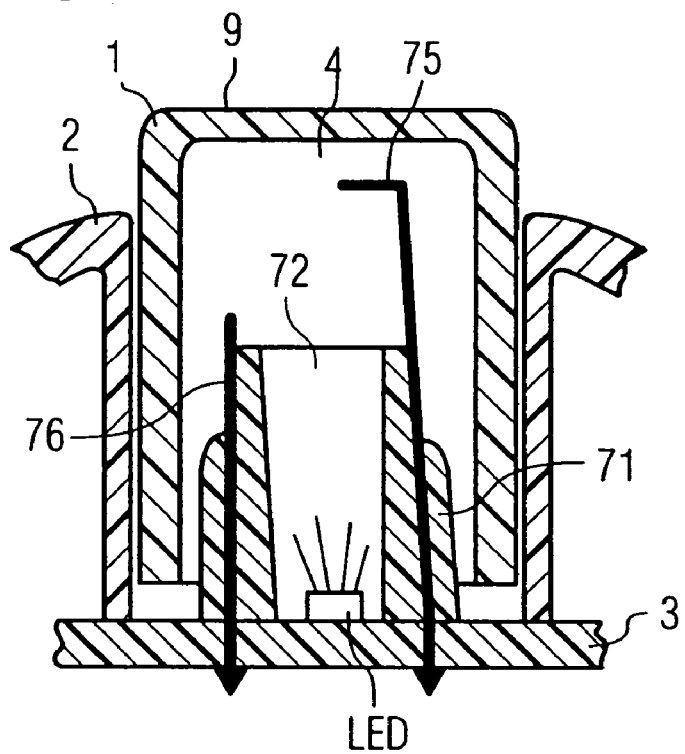
FIG. 7 is a sectional view of a seventh embodiment of a pushbutton with a hollow cylindrical member.

FIG. 7 shows a further exemplary embodiment in which a hollow cylindrical member 71 is arranged in the interior space 4 of the actuating element 1. Fastened on the member 71 are both the shielding element 76 and the sensor element 75, which are both designed as metal parts. The sensor element 75 and the shielding element 76 are soldered to the printed circuit board 3, as a result of which the hollow cylindrical member 71 is held on the printed circuit board 3. Also arranged on the printed circuit board 3 is a light-emitting diode LED that is radially surrounded by the hollow cylindrical member 71. The inside wall 72 of the hollow cylindrical member 71 is of reflecting design such that the light produced by the light-emitting diode LED reaches the front side 9 of the actuating element 1 with only slight losses. Thus, the sensor element 75 and the shielding element 76 are implemented in a single component through the integration of the sensor element 75 and the shielding element 76 in the hollow cylindrical member 71, as a result of which the mounting is substantially simplified. Moreover, the shielding element 76 and the sensor element 75 are reliably fixed in this arrangement, as a result of which contact between the sensor element 75 and the shielding element 76 is reliably prevented even in the case of use in a motor vehicle.

Figure 8:
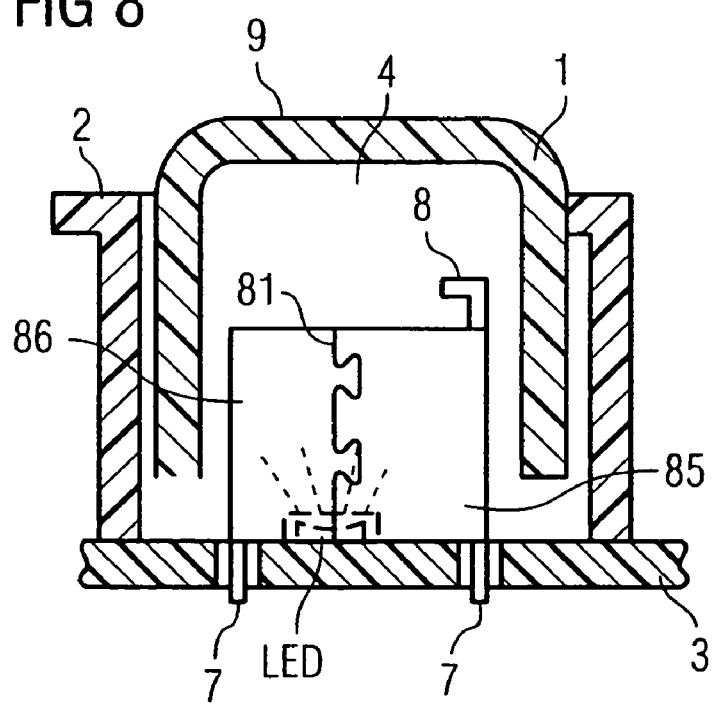
FIG. 8 is a sectional view of an eighth embodiment of a pushbutton with self-closed connection between shielding element and sensor element.

FIG. 8 is a schematic of a further exemplary embodiment of a pushbutton. The sensor element 85 and the shielding element 86 are interconnected here in a self-closed fashion and form a hollow cylindrical member that is soldered on the printed circuit board 3 by means of connecting pins 7. Also arranged on the printed circuit board 3 is a light-emitting diode LED that is radially surrounded by the member formed by the sensor element 85 and the shielding element 86. The sensor element 85 and the shielding element 86 are implemented by means of thin sheets and therefore require only a minimum installation space. At the same time, the sensor element 85 and the shielding element 86 serve the purpose of shutting off light, and prevent the lateral exit of the light produced by the light-emitting diode LED. The connecting point 81 between the sensor element 85 and the shielding element 86 insulates these two elements electrically from one another. The connection can be performed, in particular, by bonding, a reshaping process such as, for example, caulking, or by clipping.

Figure 9:
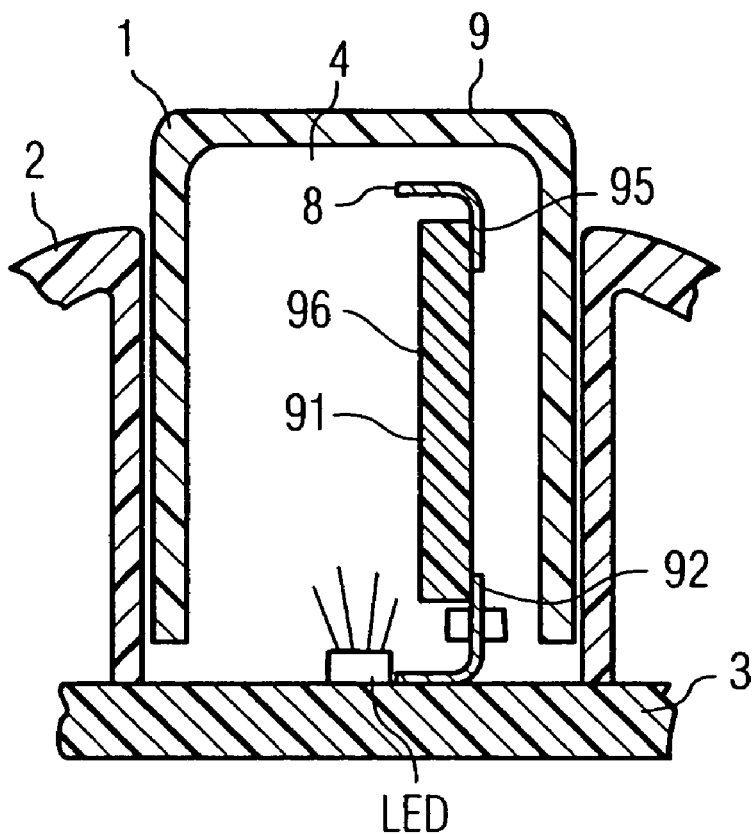
FIG. 9 is a sectional view of a fourth embodiment of a pushbutton in which the sensor element and the shielding element are arranged on a printed circuit board.

FIG. 9 shows a further exemplary embodiment of a pushbutton. Arranged now in the interior space 4 of actuating element 1 is a further printed circuit board 91 that contains both the sensor element and the shielding element. Both the sensor element and the shielding element can in this case be designed as a conductive coating of the printed circuit board. In the exemplary embodiment shown, the shielding element 96 is designed as such a coating on one side of the printed circuit board 91, while the sensor element 95 is designed as a metal element with the sensor surface 8. The sensor element 95 is connected to the printed circuit board 3 via a conductor track (not illustrated) and the connecting element 92.

Figure 10:
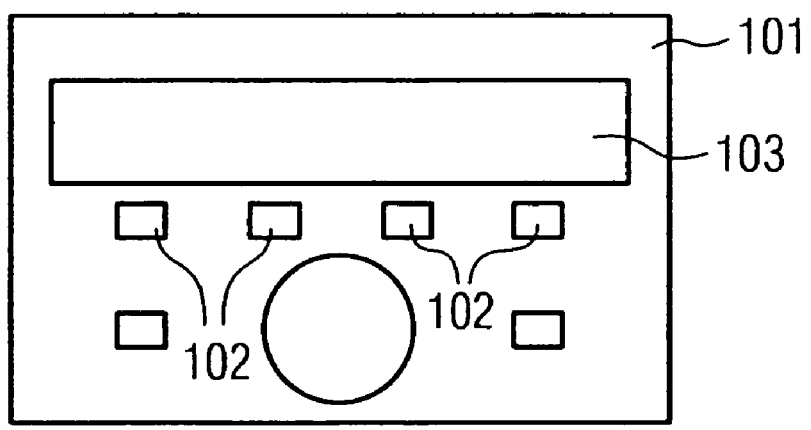
FIG. 10 shows a motor vehicle component in which the pushbutton according to present invention is incorporated.

FIG. 10 shows a motor vehicle component 101 having a number of operating elements 102 that can be designed in accordance with one of the previously described embodiments of operating elements. Arranged above the operating elements 102 is a further movable component 103 that may, for example, comprise a CD slot or a withdrawable monitor. So that a movement of the movable component 103 is not inadvertently misinterpreted as an approach of an operator to one of the operating elements 102, the operating elements 102 have an inventive design with a shielding element, the shielding element being arranged between the sensor element and the movable component 103. Thus, in the example shown in FIG. 10, movements that occur above an operating element 102 are not detected by the sensor element installed in the operating element 102.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. An operating element for a motor vehicle component, comprising:
   a carrier element;
   an actuating element movably supported in carrier element and defining an interior space;
   a switch element, said actuating element acting on said switch element; and
   a printed circuit board having a sensor element of a capacitive proximity sensor and a shielding element electrically conductively connected to said printed circuit board, said shielding element arranged and dimensioned for limiting a range of detection of said sensor element, said sensor element and said shielding element each being arranged at least partially within the interior space of said actuating element.

2. The operating element of claim 1, wherein the operating element is a pushbutton, the actuating element being linearly movably supported in said carrier element.

3. The operating element of claim 1, wherein said shielding element is pin-shaped.

4. The operating element of claim 1, wherein said sensor element is one of L-shaped or T-shaped.

5. The operating element of claim 1, wherein both said sensor element and said shielding element are spiral-shaped, said spiral-shaped sensor element being arranged radially inside said spiral-shaped shielding element.

6. The operating element of claim 1, wherein said sensor element and said shielding element are resiled against opposing internal sides of said actuating element.

7. The operating element of claim 1, wherein said sensor element and said shielding element comprise conductive coatings on different subregions of said actuating element.

8. The operating element of claim 1, further comprising a nonconducting intermediate layer interconnecting said sensor element and said shielding element in a self-closed connection.

9. The operating element of claim 1, further comprising a further printed circuit board connected to the printed circuit board and projecting into said interior space of said actuating element, said sensor element and said shielding element being arranged on said further circuit board.

10. The operating element of claim 1, wherein said actuating element further comprises a hollow cylindrical member, said sensor element and said shielding element being applied as coatings on said hollow cylindrical member.

11. An operating element for a motor vehicle component, comprising:
    a carrier element;
    an actuating element comprising a hollow cylindrical member movably supported in said carrier element and defining an interior space;
    a switch element, said actuating element acting on said switch element; and
    a printed circuit board having a sensor element of a capacitive proximity sensor and a shielding element electrically conductively connected to said printed circuit board, said shielding element arranged and dimensioned for limiting a range of detection of said sensor element, said sensor element and said shielding element each being arranged at least partially within the interior space of said actuating element said sensor element and said shielding element being fastened on said hollow cylindrical member having an inside wall of reflecting design.

12. A motor vehicle component comprising an operating unit having at least one operating element and a further movable component, said operating element comprising:
    a carrier element;
    an actuating element movably supported in said carrier element and defining an interior space;
    a switch element, said actuating element acting on said switch element; and
    a printed circuit board having a sensor element of a capacitive proximity sensor and a shielding element electrically conductively connected to said printed circuit board, said shielding element arranged and dimensioned for limiting a range of detection of said sensor element, said sensor element and said shielding element each being arranged at least partially within the interior space of said actuating element, said shielding element being arranged between said movable component and said sensor element such that said sensor element is prevented from detecting movement of said movable component.

* * * * *